US008131236B2

(12) United States Patent
Vigouroux et al.

(10) Patent No.: US 8,131,236 B2
(45) Date of Patent: Mar. 6, 2012

(54) METHOD OF SELECTING AUDIO CONTENTS RECEIVED FROM AN AUDIO OR AUDIO-VISUAL RECEIVER AND RECEIVER SELECTING THE CONTENTS IN ACCORDANCE WITH THE METHOD

(75) Inventors: Jean-Ronan Vigouroux, Rennes (FR); Nour-Eddine Tazine, Noyal sur Vilaine (FR); Louis Chevallier, La Meziere (FR)

(73) Assignee: Thomson Licensing, Boulogne-Billancourt (FR)

( * ) Notice: Subject to any disclaimer, the term of this patent is extended or adjusted under 35 U.S.C. 154(b) by 789 days.

(21) Appl. No.: 11/920,307

(22) PCT Filed: Apr. 20, 2006

(86) PCT No.: PCT/EP2006/061721
§ 371 (c)(1),
(2), (4) Date: Nov. 13, 2007

(87) PCT Pub. No.: WO2006/122862
PCT Pub. Date: Nov. 23, 2006

(65) Prior Publication Data
US 2009/0098843 A1    Apr. 16, 2009

(30) Foreign Application Priority Data
May 19, 2005   (FR) ...................................... 05 51294

(51) Int. Cl.
*H04B 1/18* (2006.01)

(52) U.S. Cl. .................. 455/186.1; 455/161.2

(58) Field of Classification Search ............... 455/152.1, 455/158, 161.1, 161.2, 161.3, 185.1, 186.1
See application file for complete search history.

(56) References Cited

U.S. PATENT DOCUMENTS

| | | | |
|---|---|---|---|
| 4,499,601 A | 2/1985 | Matthews | |
| 5,345,607 A | 9/1994 | Liman et al. | |
| 5,475,874 A | 12/1995 | Klos | |
| 6,611,678 B1 * | 8/2003 | Zweig et al. | ............... 455/161.3 |

(Continued)

FOREIGN PATENT DOCUMENTS

DE        19502359        8/1996

(Continued)

OTHER PUBLICATIONS

Search Report Dated Jul. 25, 2006.

*Primary Examiner* — Thanh Le
(74) *Attorney, Agent, or Firm* — Tutunjian & Bitetto, P.C.

(57) ABSTRACT

The present invention relates to a method of selecting sound contents transmitted by transmission channels and received by an audio or audiovisual receiver. A user first selects a received content and starts playback. Then, the receiver automatically searches among the contents transmitted by the transmission channels for a content whose audio parameters have values close to the values of a previously selected content and plays it back at the end of the current content. The operation is renewed each time the current content ends. According to a refinement, the receiver has a memory that makes it possible to offset the playback of the content in time and thus best synchronize the playback of the various selected contents. The invention also relates to an appliance capable of selecting audio contents originating from several channels and having similar audio characteristics, and playing them back automatically.

12 Claims, 4 Drawing Sheets

U.S. PATENT DOCUMENTS

| | | |
|---|---|---|
| 6,748,237 B1 | 6/2004 | Bates et al. |
| 2002/0140870 A1 | 10/2002 | Gutta et al. |
| 2003/0026344 A1 | 2/2003 | Rindsberg et al. |
| 2004/0034536 A1 | 2/2004 | Hughes |
| 2004/0073926 A1 | 4/2004 | Nakamura et al. |
| 2005/0020223 A1* | 1/2005 | Ellis et al. ............ 455/186.1 |

FOREIGN PATENT DOCUMENTS

| | | |
|---|---|---|
| EP | 0680166 | 11/1995 |
| WO | WO02067447 | 8/2002 |

* cited by examiner

Fig. 1

| Low level parameter values of sound contents | | | | | | |
|---|---|---|---|---|---|---|
| Document title | Time | Energy | Zero-crossing ratio | Brightness | Envelope | Bandwidth |
| Chanson pour passer le temps | 51143 1.86147 | 1.18507 E+8 | 34925 | 3,57 −759.773 | 3464.9 4637.7 | 5666 57743.9 |
| La baleine Bleu | 22546 2.2132 | 2.45232 E+8 | 15421 | 4,23 −852,2 | 5226 4512.2 | 6233 51283.9 |
| It's too late | 44592 1.5623 | 1.1206 E+8 | 34509 | 5,02 −785.773 | 4699.2 5022.8 | 5526 32593.9 |
| Le chant de la Mer | 34512 1.9445 | 1.84215 E+8 | 39444 | 4,57 −612.1 | 5690 4220.8 | 51254 55263.8 |
| God save the queen | 50122 1.9045 | 1.2451 E+8 | 24567 | 4,56 −899.01 | 5692.1 5523.2 | 5256 57998.7 |
| The Partisan | 49223 2.1405 | 1.407 E+8 | 28102 | 6,23 −611.744 | 3884.9 4567.7 | 5687 51543.5 |
| Daddy Cool | 48599 1.8956 | 1.1054 E+8 | 31022 | 6,01 −562.02 | 3169.2 4199.7 | 5126 57225.0 |
| La vie en Rose | 21559 1.9985 | 1.72945 E+8 | 37405 | 4,58 −566.23 | 3464.9 3652.7 | 5654 57743.6 |
| Ne me Quittes pas | 44560 1.8944 | 1.4098 E+8 | 39552 | 3,95 −523.012 | 5264 4415.7 | 5989 55513.8 |
| La Mer | 53555 2.2600 | 1.244 8 | 38626 | 4,98 −528.888 | 3844.5 3926.7 | 5777 52153.2 |

METHOD OF SELECTING AUDIO CONTENTS RECEIVED FROM AN AUDIO OR AUDIO-VISUAL RECEIVER AND RECEIVER SELECTING THE CONTENTS IN ACCORDANCE WITH THE METHOD

This application claims the benefit, under 35 U.S.C. §365 of International Application PCT/EP2006/061721, filed Apr. 20, 2006, which was published in accordance with PCT Article 21(2) on Nov. 23, 2006 in French and which claims the benefit of French patent application No. 0551294, filed May 19, 2005.

The invention relates to a method of selecting sound contents transmitted in streams and received by an audio receiver, and a playback appliance playing back the selected contents according to the method.

These days, users have access to a large number of sound contents by downloading, purchasing media, listening to radio stations, selecting digital streams, and so on. Using a radio receiver, the user can browse from station to station and, depending on the sound content, select the one whose transmitted content is most agreeable to him. With the RDS system, data is transmitted with the sound signals, so the user can, for example, see on his receiver's screen, the name of the transmitting station. Other receivers can be used to play back audio contents. In the digital television domain, multiplexed digital streams are transmitted over one or more frequency channels and received via a set-top box. Service data is used to identify the different streams and the audiovisual contents transmitted. Other data is used to display electronic program guides (EPG), this data giving information on the transmitted contents such as: title, duration, date and time of transmission, format, etc. In addition to the audiovisual channels, the bouquet also comprises radio stations. The EPG displays the names of the stations and the sound contents currently transmitted and planned. This reception method provides for digital quality on playback, facilities concerning the programming of recordings, indications on the content enabling it to be classified in a database, and so on. In this way, the user can generate a list of contents of interest to him, and arrange their playback in sequence.

Faced with a large quantity of sound contents, the user can come up against the difficulty of choosing the audio contents and arranging them in sequence in order to create a coherent and harmonious set. Patent application FR 2 857 122 filed on Jul. 3, 2003 by the Applicant discloses a new concept of navigation within a set of audio contents. The concept is based on the display of a graphic representation of the set and a strategy based on a graphic relation uniting certain graphic identifiers. Thus, the user can see on the graphic page, how the sequencing of the sound contents available within his terminal changes. The positioning of the representations of the contents in the graphic page, which depends on low-level parameters calculated for each content, makes it possible to define a navigation strategy which is reflected in a certain auditory continuity.

The signal analysis techniques used in this application make it possible to calculate, for each audio content, so-called "low-level" parameter values. These parameters are, for example: tempo, energy, brightness, envelope, and so on. They are determined by analysing the signal either in its digital form or in its analogue form. An audio content indexing technique is explained in the article "Speech and Language Technologies for audio indexing and retrieval" published in August 2000 in the IEEE review, pages 1338 to 1353 of volume 88. The article explains how, by analysing the audio signal, the different contents can be classified. Other articles describe the means of calculating low-level parameters and possible uses; other articles included for reference in the present patent application are:

B. Feiten and S. Gunzel, Automatic indexing of a Sound Database using self-organizing neural networks, Computer Music Journal, 18 (3°, 1994).

Eric Scheirer, Music Listening systems, PhD thesis, MIT Media Laboratory, April 2000.

The technique described in the application uses a graphic projection of the points representing each content. The user visually perceives the logic used to sequence the contents one after the other. However, this technique is not practical if the receiver has no graphic interface. Moreover, the technique described in the preceding application is based on a stored database, which makes it possible to analyse all the contents and produce the ordered list of contents to be played back. If the sound contents are continually transmitted, the appliance does not have a database capable of producing an ordered list.

U.S. Pat. No. 6,611,678—ZWEIG describes a radio receiver playing back the radio stations whose musical theme corresponds to that of the user. For this, the appliance scans the radio channels and analyses the acoustic spectra of the sound extracts in order to classify them according to musical criteria. It thus constructs a database in which all the radio stations are assigned a classification according to one or several musical criteria. The appliance will then compare the classification with the preferences of the user and preferably play back the stations whose musical theme is appreciated by the user. When the receiver changes region, all the stations of that region are scanned and those that correspond to the musical criteria of the user are added to the internal database. This appliance requires a major computation power and continual scanning of the frequencies to keep the classification of the radio stations up to date.

The present invention enables a user to select a transmitted sound content then leave the appliance to play back other contents presenting a certain auditory similarity. The contents are transmitted and cannot therefore be predicted, which provides an element of surprise for the user added to the fact that they are selected according to the tastes of the user. Moreover, the appliance does not need a sophisticated graphic interface, which makes it very simple to use. Furthermore, the computation power used by the appliance is minimized and the classification according to the audio criteria of each transmitter can easily be updated.

One subject of the present invention is a method of selecting sound contents transmitted over at least one transmission channel and received on an audio or audiovisual receiver; the method comprising an initial step for playback of a sound content transmitted by a channel, characterized in that the receiver comprises a means for iteratively executing the following steps:
  reception of audio parameters associated with at least one transmitted sound content,
  selection of a new sound content whose audio parameters have values close to the values of a content previously played back,
  playback of the newly selected content.

The present invention enables a user to play back in turn radio contents received, for example, from a transmission network while retaining a certain musical unity or at least a certain logic. Furthermore, the interface with the user can be simple and requires only a minimum of manipulation. The search for and automatic selection of content gives the user a pleasing surprise effect because he does not know in advance which sound contents will be selected and played back. Furthermore, the transmitter calculates the audio parameters just once, so each receiver does not have to do so.

According to a first refinement, the method comprises a step for reception of a plurality of audio parameters associated with contents transmitted over several transmission channels. In this way, the receiver can determine the channel that transmits the most agreeable audio content.

According to another refinement, the audio parameters of the next content are received by the receiver before this content is transmitted. The step for selection is then carried out while the preceding content is being transmitted or even a set of similar contents is determined following the selection of an initial content by the user. In this way, the receiver can anticipate the transmission of the selected document.

According to another refinement, the anticipation consists in having the receiver perform the switchover to the channel transmitting the selected content at the moment when the transmission of the selected content begins. In this way, the receiver starts playback precisely at the moment when the transmission of the selected content begins.

According to a variant, the receiver performs the switchover to the channel transmitting the selected content at the end of the playback of the preceding content. According to this variant, priority is given to the end of the contents, this part of the sound content being guaranteed.

According to another refinement, the method comprises a step for a user to enter a command to select a content, the audio parameters of the new selected content being similar to the content initially selected by the user. In this way, the selected documents are similar to the initial document, and the musical types of the selected contents remain very similar to the one chosen by the user. According to a variant, the audio parameters of the new selected content are similar to the one currently being played back. In this way, a certain difference in the musical types of the contents played back may be observed, which adds a new element of surprise.

According to another refinement, the method comprises a step for storage of the selected content on the receiver, the playback of the selected content occurring at the end of the playback of the preceding content. In this way, the contents are strung together one after the other, the start of one content occurring just after the end of the preceding content.

Another subject of the invention is a playback appliance comprising a means of receiving sound contents transmitted over at least one transmission channel; characterized in that it comprises:
- a means of receiving audio parameters associated with at least one transmitted sound content,
- a means of comparison between the audio parameters of a content previously played back and the audio parameters of the contents received by the reception means,
- a means of selecting the audio content whose received audio parameters are the closest to a content previously played back,
- a playback means playing back the newly selected content after the content currently being played back, at least the comparison, selection and playback means being strung together automatically so as to obtain a continuous playback of sound contents.

Other features and advantages of the invention will now become apparent with more details in the context of the description that follows of exemplary embodiments described by way of illustration with reference to the appended figures which represent.

Figure 1:
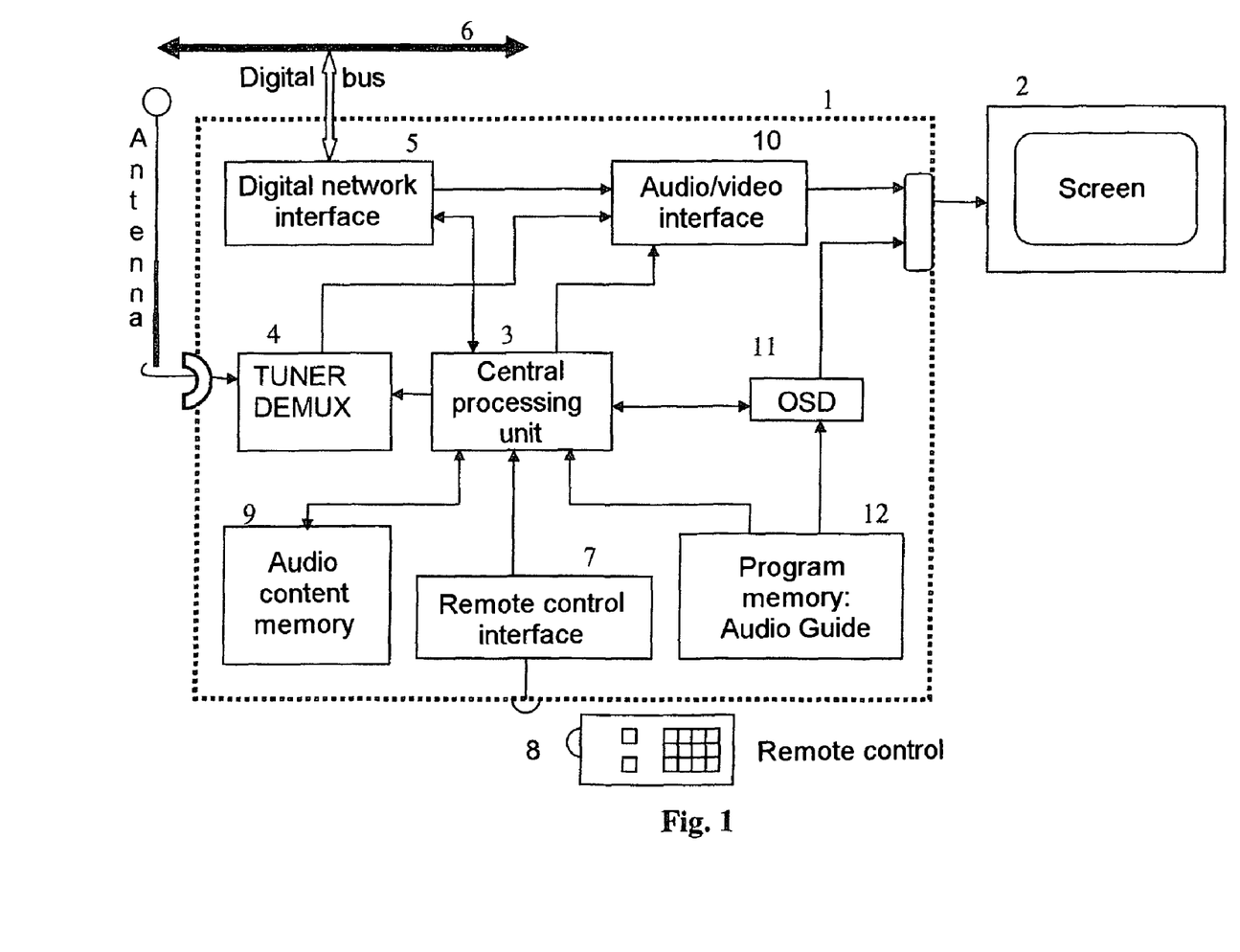
FIG. 1 is a block diagram of a playback appliance for implementing the invention.

According to one preferred exemplary embodiment, the reception of the audio channels is performed using a playback appliance as represented in FIG. 1, typically an audiovisual receiver 1 associated with a display device 2. The receiver comprises a central processing unit 3 linked to a program memory 12, and an interface 5 for communication with a local high speed digital bus 6 making it possible to receive information on the transmitted audio contents. This network is, for example, an IEEE 1394 network. The receiver can also receive audio and/or video data from a transmission network via a reception antenna associated with a demodulator 4, this network possibly being of radio, cable or satellite type. The transmission is unidirectional, that is, the receiver has no control of the signals received from this network, or of the contents transmitted, or of the moment of transmission. The receiver also comprises an infrared signal receiver 7 for receiving the signals from a remote control 8, and an audio/video decoding logic 10 for generating audiovisual signals sent to the television screen 2. The remote control 8 is provided with direction keys ↑, ⇓, → and ← and "OK" and "Select" keys. According to a refinement, the playback appliance 1 is provided with a memory 9 for storing audio contents. Typically this memory 9 is implemented by an integrated circuit of several megabytes, thus storing a few minutes of audio content. According to a variant, the memory 9 is a gigabyte hard disk for example. The storage of one minute of audio content in MP3 format occupying approximately 1 megabyte, such a disk is capable of recording 150 hours of sound contents.

The receiver also comprises a circuit 11 for displaying data on the screen, often called OSD (On Screen Display) circuit. The OSD circuit 11 is a text and graphics generator which makes it possible to display on the screen menus, pictograms or other graphics, and menus informing the user of the audio contents that can be accessed. The OSD circuit is controlled by the central processing unit 3 and an audio guide. The audio guide is advantageously implemented in the form of a program module stored in the memory 12. It can also be implemented in the form of an ASIC-type custom circuit for example.

The audio contents are transmitted permanently on a plurality of transmission network channels, the channels being of frequency or digital type. The audio guide makes it possible to navigate from one channel to another by displaying a menu. This menu indicates the name of the channel and the title of the audio content currently be transmitted. Using the ↑, ⇓, → and ← keys on the remote control 8, the user can highlight a title and, by pressing "OK" or "Select", start playback on the speakers of the audiovisual receiver. The audio signals are preferably transmitted in digital form, a variant consisting in transmitting analogue signals on frequency channels. In digital mode, the audio contents are coded according to a compression standard, MP3 for example, and transmitted coded in packets identified by a header. In addition to the audio content, the signals contain data such as the identifier of the channel, the title of the audio document being transmitted, its theme, its duration or its end time, etc.

Figure 2:
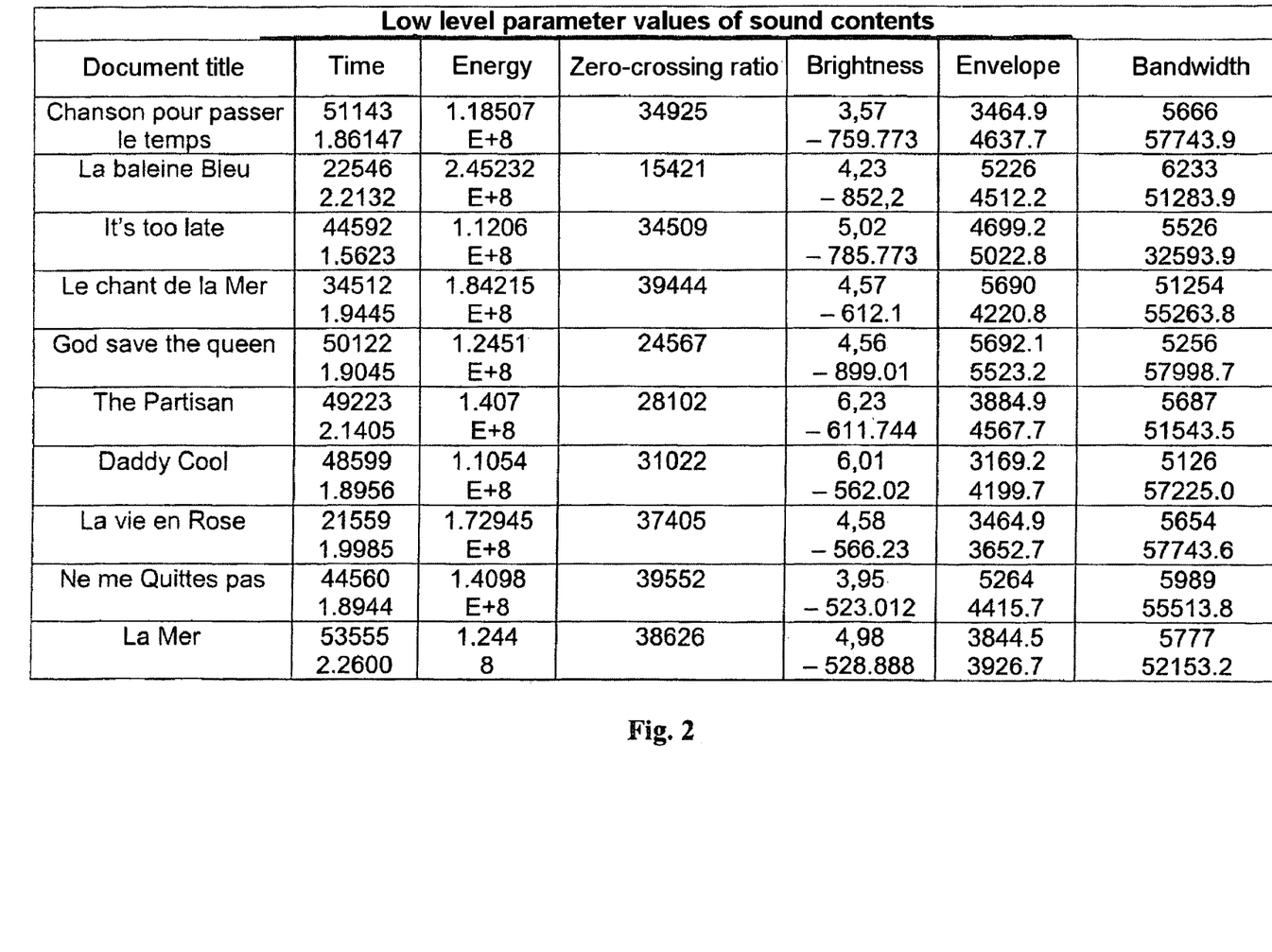
FIG. 2 is a table, associating for each document of the collection, its low-level parameter values.

According to a preferred exemplary embodiment, the signals also contain the low-level audio parameters characterizing the document. FIG. 2 gives examples of low-level parameter values forming the descriptors of a certain number of audio documents. The first column of the table gives the title of the audio content, each content being numbered. The subsequent columns give the low-level parameter values associated with the document, such as the mean sound intensity, the tempo, the energy, the zero crossing rate, the brightness, the envelope, the bandwidth, loudness, cepstral coefficients, and so on. The parameters are determined by the audio content producer or transmitter which is particularly advantageously because the calculation is done only once for all the receivers 1. Each audio content is characterized by its low-level parameters, these being transmitted in round robin fashion at least throughout the transmission time of the content. If the reception is digital, the playback appliance receives all the low-level parameters of all the audio documents transmitted by all the channels of the transmission bouquet. According to a variant, the audio contents are transmitted over a transmission network, and the audio parameters over the digital network 6. The user can ask a server for the continuous transmission of the audio parameters of the documents transmitted on a large number of channels. The receiver selects the transmission channel according to the parameters received from the digital network 6.

Figure 3:
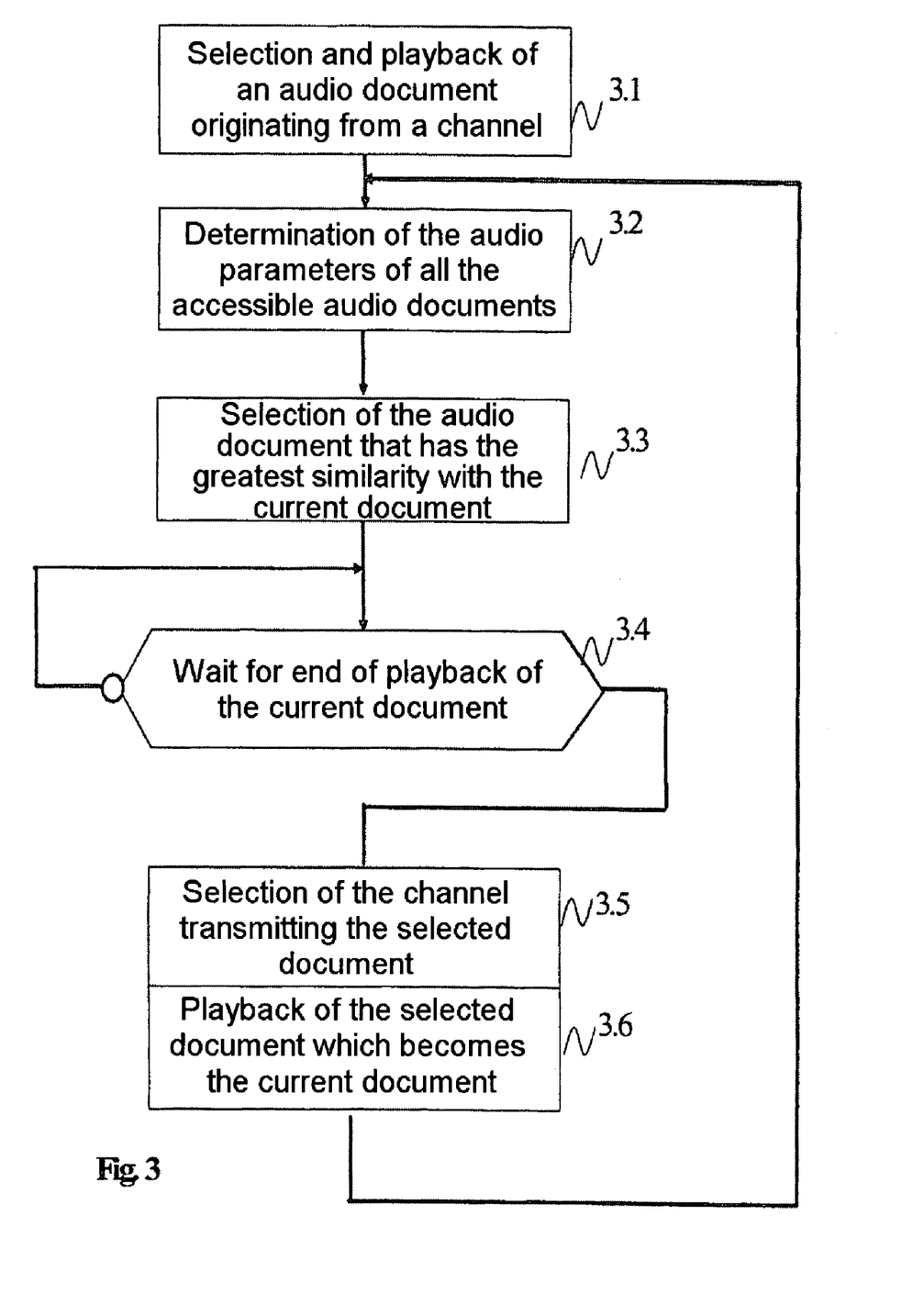
FIG. 3 represents a flow diagram explaining the processing of the low-level parameters according to one exemplary embodiment of the invention.

Using the flow diagram represented in FIG. 3, we will now explain how these parameters are processed and how the audio guide automatically selects the audio contents in order to provide the user with continuous playback.

Initially, in the step 3.1, the user selects a channel and plays the document currently being transmitted. During playback (step 3.2), the audio guide retrieves all the low-level parameters of all the contents that can be accessed by the receiver 1. In the step 3.3, the guide thus determines the characteristics of the current document and performs calculations with all the other groups of low-level parameters in order to determine a level of similarity between the other audio documents and the one being transmitted. "Similarity" should be understood to mean that the audio contents have an acoustic resemblance both at type level (voice, classical instrument, synthesizer, etc.), and at rhythm or sound power level. The guide then selects the audio content that has the greatest similarity with the document currently being played back. The guide then waits for the end of the document currently being played back (step 3.4). Preferably, the end of a document is indicated by the transmitter either by an end signal, or by an indication of the document's transmission duration. The receiver can automatically detect the end, but the error rate is high.

When the end of the document occurs, the guide selects the channel transmitting the selected document (step 3.5). The characteristics of the channel are in the data associated with the parameters of the document and its title. Finally in the step 3.6, the audio guide plays back the document transmitted by the channel then loops back to the step 3.2 in order to determine the new parameters of the audio documents that are currently accessible. In this way, the user hears a succession of acoustic pieces having strong similarities with the one he selected first. Furthermore, since the documents are received from unidirectional channels with no control by the user as to the choice and the moment of the audio content, the user does not know in advance which contents are transmitted, and even less those selected by the audio guide. Because of this, the audio guide produces an element of surprise for the user.

One method of determining the level of similarity between audio documents from their low-level parameters is to represent the documents by points within a geometrical space. Take, for example, a two-dimensional space, with a point Pi of coordinates (xi, yi) representing a sound document Si. The coordinates (xi, yi) are obtained by projection from the point Pi whose coordinates are the values of the low-level descriptors on a sound sample, on a plane. The projection is determined by main component analysis, ACP. ACP is in particular described in the Saporta 1990 document, entitled "Probabilités Analyse de données et statistiques", Edition Technip. The purpose of this data analysis algorithm is to find a subsystem of axes linked by an affine transformation to the original which best "spreads" the samples, these axes tending to intermingle the correlated original axes. Since the low-level descriptors are assumed to have a perceptual consistency (the sounds are considered close if, and only if, the values of the low-level descriptors are close), and the projection is continuous, sounds considered to be close are projected by points close to the screen. This example in no way precludes representing the audio documents within a space with more than two dimensions. Generally, the coordinates $\{x_i, y2, \ldots zi\}$ of a point associated with a document in a multidimensional space make it possible to locate its acoustic content among the other sound documents. In practice, if two points are distant in the multidimensional space, the values of their low-level parameters are very different and therefore the two documents have a different acoustic type, such as, for example, a gentle song sung acapella and a symphony played by an orchestra. There are data analysis techniques that can be used to discover the dimensions (or combinations of dimensions) that predominate in a certain set of songs. It is possible to obtain a diagrammatic representation by indicating that it is dimensions corresponding to the axes according to which the songs are distributed most widely. The similarity of two sound documents can be assessed as the distance between the two points representing the two documents within the multidimensional space. Another method of determining similarities between audio documents involves not projecting on a geometrical plane but calculating distances in the starting space of the low-level parameters. There is no need to have available coordinates to calculate the distances. It is possible, for example, to use a method that gives the distance between two documents, for example based on a form of correlation. From this set of mutual distances, it is possible to calculate positions for the pieces that best represent the distances, by means of multidimensional scaling algorithms, for example.

Figure 4:
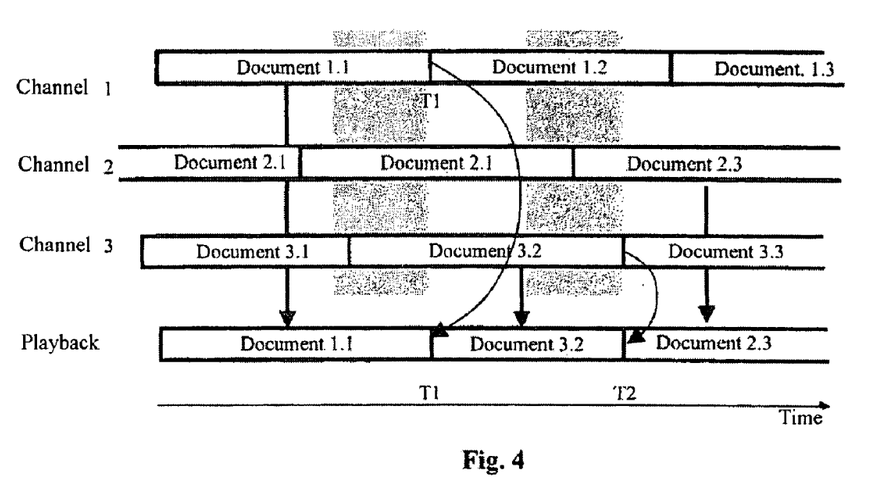
FIG. 4 represents a timing diagram of the events transmitted on different streams and the documents actually played back.

FIG. 4 represents a timing diagram of the documents transmitted on different streams and actually played back. At the outset, the user chooses the audio document transmitted on channel 1. During a predetermined time of a few minutes up to the moment T1 when the playback of the document 1.1 ends, represented by a shaded area in FIG. 4, the audio guide determines which document is transmitted by one of the channels whose audio characteristic are the closest to that currently being played back. The guide then selects the document 3.2 transmitted by the channel 3. At the instant T1 which corresponds to the end of the transmission of this document, the receiver then switches over to the channel 3 in order to play back the audio signals originating from this channel. Similarly, during the same predetermined time of a few minutes until the moment T2 when the playback of the current document ends, the audio guide determines which document is transmitted by one of the channels whose audio characteristics are the closest to the document 3.2 currently being transmitted. The audio guide then selects the document 2.3 transmitted by the channel 2. The receiver 1 then switches over to the channel 2 in order to play back the audio signals, and so on, until the user either stops the audio guide, and in this case the receiver remains on that channel, or switches off the receiver 1. In the latter case, when switched on again, the receiver remains on the audio guide function and starts by searching for a channel playing back a document whose audio characteristics are the closest to that which was being played back at the moment of switch-off.

Preferably, the audio guide selects and plays back audio contents close to the content initially selected by the user. In this way, the contents played back are always very close to that selected by the user. According to a variant, the audio guide selects a content close to that currently being played back. In this way, during playbacks, the theme of the contents can change and move away from that chosen by the user, which provides for a far greater variation.

According to a first refinement, the low-level parameters are transmitted before playback of the associated document, for example one minute before, which allows for anticipation. Thus, the guide can each minute determine the document that will be transmitted and that has a strong similarity with the current document. In this way, the selection process is performed before the end of the current playback. The audio guide displays, 30 seconds before, the title of the content that will be played back. The audio documents are transmitted over different channels. Since their document durations vary considerably from one to another, the starts and/or the ends cannot be synchronized. It is recognized that it is preferable to cut the end of a sound document rather than the start. According to a refinement, the audio guide chooses to cut the end of the current document in order to be synchronized on the start of the next document. For this, during the last minute of document playback, the guide first selects the audio documents that will start to be transmitted during this same minute. Then, within this group, the guide selects the document that has the greatest similarity with the audio document currently being played back or with the document initially selected by the user. The switchover from the channel transmitting the current document to the channel transmitting the selected document is performed at the moment when the transmission of the selected document begins. Advantageously, just before the switchover, the guide orders a lowering of the sound level in order to simulate the end of the current audio content and thus make the transition from one document to another more harmonious.

According to a variant, at least some low-level parameters are calculated on the receiver. For each of the channels that do not transmit the low-level parameters associated with the audio documents, the receiver 1 receives the packets containing the audio signals and extracts the low-level parameters from them. This variant provides a saving on the bandwidth of the transmission network. It also makes it possible to define a bouquet of channels transmitting audio contents, and scan only these channels. On the other hand, it requires the receiver to have significant computation power. According to this variant, when the first audio document ends, the audio guide plays back the document selected from the received data packets.

According to a refinement, the receiver 1 has two reception means making it possible to receive the signals originating from two frequency channels, the means typically being demodulators (tuners). A tuner is set to receive the channel transmitting the current document. The second tuner navigates from one frequency channel to another to analyse the audio signals and look for the document whose sounds are the closest. Once found, the second tuner remains set to the channel transmitting the new document which becomes the current document and the first tuner performs the search.

Advantageously, a little time before the end of the current document, typically ten seconds, the audio guide mixes the sound of the two documents, gradually increasing the volume of the new document while lowering that of the current document. This mixing provides for a harmonious transition from one document to the other.

According to another variant, if the low-level parameters are transmitted on another frequency channel, the use of a second tuner makes it possible to extract them while playing back the current document.

According to another refinement, the receiver uses the memory 9 to temporarily store the audio contents to be played back. In this way, the receiver can introduce a delay from a few seconds to a few minutes between the moment of reception of the audio signals and the moment when they are played back. During this delay, the receiver can search for other audio documents, select one whose acoustic characteristics are similar, and begin to save it. At the end of the current document, the guide then extracts the new document from the memory. In this way, the synchronization between the playbacks of the two documents is enhanced. In as much as the two documents are available in the memory 9 of the receiver, the guide can perform a sound mixing of the two documents by gradually increasing the volume of the new document while lowering that of the current document.

Figure 5:
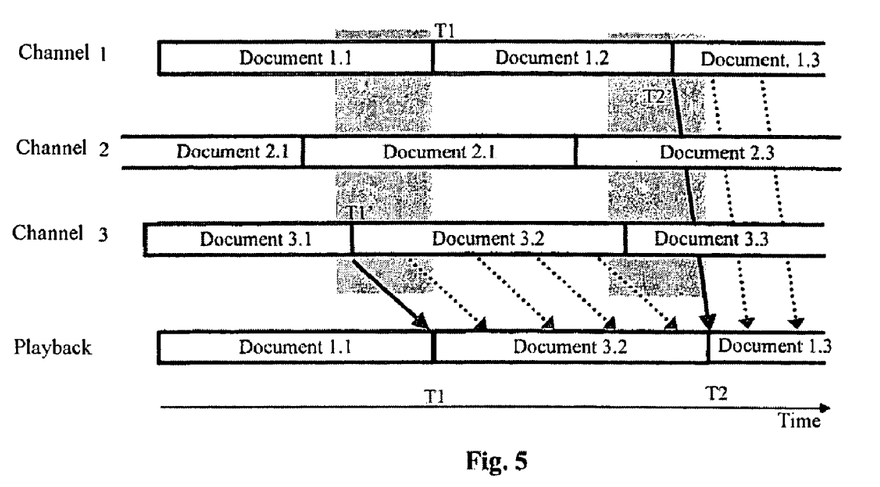
FIG. 5 represents a timing diagram of the events transmitted on different streams and the documents actually played back, using the storage of audio contents.

FIG. 5 is a timing diagram of the events transmitted on different streams and the documents actually played back, using the audio content storage facility. At the start, the user chooses the audio document 1.1 transmitted over the channel 1, ending at the instant T1. During a determined period of a few minutes ending on playback of the document 1.1, represented by a shaded area in FIG. 5, the audio guide analyses the various transmitted contents and selects the document 3.2 transmitted by the channel 3 at the instant T1'. At the moment T1', the document 3.1 is saved in the memory 9. The document 1.1 then finishes being played back. At the end of the playback of the document 1.1 (instant T1), the document 3.1 is read and played back. In this way, the memory 9 can be used to offset in time, via period (T1-T1'), the playback of the document 3.2. Then, a little time before the playback of the current document ends, the guide searches again for a document whose audio characteristics are the closest to the document 3.2. In the example of FIG. 5, the guide determines that it is the document transmitted by the channel 1 at the instant T2'. From the moment T2', the memory 9 saves the document 1.3 and at the same time supplies the data of the document 3.2. At the end of the reading of the document 3.2, its memory space is released, and the document 1.3 starts to be played back. The process will then be repeated, before the end of the current playback, the guide selecting the new document and starting to save it. According to a refinement, a few minutes before the end of the playback, the guide performs a first selection but continues to analyse the various documents transmitted over the various channels. In the example of FIG. 5, the guide first selects the document 2.3. If, before the end of the playback of the current document, another document appears whose audio characteristics are even closer, then the latter will be saved instead of the one that was previously selected. In the example, the document 1.3 takes the place of the document 2.3. Advantageously, the time shift function can be disabled and activated using a user command. When activated, a light indicator is lit, indicating to the user that the audio content is not played back in real time. This way, the user knows that the time indications—for example: pulses transmitted at the top of the hour—indicated by the channel do not occur at the right moment.

Advantageously, the transition from one document to the other is displayed on the screen 2. First, the guide displays the document selected by the user. Then, as soon as the new document is selected, its title is displayed below. Finally, at the moment of the transition, the first title is deleted and the second is graphically highlighted, before being replaced by the next.

The invention also relates to appliances that do not have a graphic interface, or have only a very limited graphic interface, such as a portable radio for example. In this case, firstly, the user flicks from one channel to another and, once the content transmitted from one of them is agreeable to him it is selected and the guide continues to offer the user a succession of contents.

Although the present invention has been described with reference to the particular embodiments illustrated, the latter is by no means limited by these embodiments, but only by the appended claims. It will be noted that changes or modifications can be made by those skilled in the art.

It should be noted that the invention can also be applied to the selection of contents other than audio contents: video and audiovisual contents, fixed images, texts, and so on, provided that there are appropriate characterization parameters available.

The invention claimed is:

1. Method of selecting sound contents transmitted over at least one transmission channel and received on an audio or audiovisual receiver; the method comprising the following steps
    playback of a sound content transmitted by a channel, wherein it comprises the steps:
    reception of low-level audio parameters associated with at least one transmitted sound content,
    selection by the audio or audiovisual receiver of a new sound content whose low-level audio parameters have values close to the values of a content currently played back,
    storage of the selected content on the receiver,
    automatically playback of the stored content immediately following the playback of the current content so as to obtain a continuous playback of sound contents.

2. Method according to claim 1, wherein the step for selection of the new sound content takes place during a determined time preceding the end of the current sound content.

3. Method according to claim 1, wherein the selection step consists in selecting the transmitted sound content whose low-level audio parameters best correspond to those of the current sound content.

4. Method according to claim 1, wherein it comprises a mixing step during which the current sound content and the new sound content are played back.

5. Method according to claim 1, wherein it comprises a step for display of an indicator when the sound content currently being played back is extracted from the memory.

6. Method according to claim 1, wherein the low-level audio parameters include at least one of mean sound intensity, tempo, energy, zero crossing rate, brightness, envelope, loudness, and cepstral coefficients.

7. Playback appliance comprising a receiver of sound contents transmitted over at least one transmission channel; comprising:
    a playback circuit playing back a received sound content,
    a receiver of low-level audio parameters associated with transmitted sound contents,
    a circuit of selection of the transmitted audio content whose received low-level audio parameters are the closest to a content currently being played back,
    wherein it also comprises:
    a memory for storing the selected audio content,
    the appliance automatically playing back the content stored in the memory immediately following the current content, at least the selector and the playback circuit being strung together automatically so as to obtain a continuous playback of sound contents.

8. Playback appliance according to claim 7; wherein the selector analyzes the low-level audio parameters received during a determined time preceding the end of the current sound content.

9. Playback appliance according to claim 7; wherein the selector selects the transmitted sound content whose low-level audio parameters best correspond to those of the current sound content.

10. Playback appliance according to claim 7; wherein, at the end of the playback of a current content, the playback circuit mixes this content with the content extracted from the memory.

11. Playback appliance according to claim 7; wherein an indicator is displayed when the document currently being played back is extracted from the storage means.

12. Playback appliance according to claim 7, wherein the low-level audio parameters include at least one of mean sound intensity, tempo, energy, zero crossing rate, brightness, envelope, loudness, and cepstral coefficients.

* * * * *